(12) United States Patent (10) Patent No.: US 9,415,328 B2
Buck et al. (45) Date of Patent: *Aug. 16, 2016

(54) MODIFIED SURFACES

(71) Applicant: UNIVERSITY COURT OF THE UNIVERSITY OF ST ANDREWS, St Andrews, Fife (GB)

(72) Inventors: Manfred Buck, Fife (GB); Rafael Madueño, Córdoba (ES); Christophe Silien, Limerick (IE); Minna Tuulia Räisänen, Helsinki (FI)

(73) Assignee: University Court of the University of St Andrews (GB)

( * ) Notice: Subject to any disclaimer, the term of this patent is extended or adjusted under 35 U.S.C. 154(b) by 166 days.

This patent is subject to a terminal disclaimer.

(21) Appl. No.: 14/318,474

(22) Filed: Jun. 27, 2014

(65) Prior Publication Data

US 2014/0311966 A1 Oct. 23, 2014

Related U.S. Application Data

(62) Division of application No. 13/003,213, filed as application No. PCT/GB2009/001701 on Jul. 10, 2009, now Pat. No. 8,778,454.

(30) Foreign Application Priority Data

Jul. 10, 2008 (GB) .................................. 0812597.3

(51) Int. Cl.
*B01D 15/10* (2006.01)
*C23C 28/02* (2006.01)

(Continued)

(52) U.S. Cl.
CPC ............ *B01D 15/10* (2013.01); *B81C 1/00206* (2013.01); *B82Y 30/00* (2013.01);
(Continued)

(58) Field of Classification Search
CPC .... B05D 1/185; C23C 28/00; B81C 1/00206; B82Y 30/00
See application file for complete search history.

(56) References Cited

U.S. PATENT DOCUMENTS 5,852,127 A 12/1998 Belfort et al.
8,778,454 B2 * 7/2014 Buck ............................ 427/256
(Continued)

FOREIGN PATENT DOCUMENTS

EP 1593650 A 11/2005
WO WO 2008/006520 A2 1/2008

OTHER PUBLICATIONS

Aakeroy and Seddon, "The hydrogen bond and crystal engineering", Chem. Soc. Rev., vol. 22, pp. 397-407 (1993).
(Continued)

*Primary Examiner* — James M Mellott
(74) *Attorney, Agent, or Firm* — Susan T. Evans; McDermott Will & Emery LLP

(57) ABSTRACT

The invention provides a method for producing a modified surface (5) comprising: patterning a surface (7) by forming thereon a porous molecular network (9) defined by non-covalent interactions between constituent molecules; and depositing in said porous network (9) and on said patterned surface (11) molecules (13) so as to form a self-assembled monolayer (15), wherein both said patterning and said depositing are effected by contact with liquids.

19 Claims, 7 Drawing Sheets

(51) Int. Cl.
| | |
|---|---|
| C25D 7/00 | (2006.01) |
| C23C 28/00 | (2006.01) |
| B81C 1/00 | (2006.01) |
| C25D 5/34 | (2006.01) |
| B82Y 30/00 | (2011.01) |
| B05D 1/18 | (2006.01) |

(52) U.S. Cl.
CPC ............... *C23C 28/00* (2013.01); *C23C 28/02* (2013.01); *C25D 5/34* (2013.01); *C25D 7/00* (2013.01); *B05D 1/185* (2013.01); *Y10T 428/24802* (2015.01)

(56) References Cited

U.S. PATENT DOCUMENTS

| | | |
|---|---|---|
| 2005/0214471 A1 | 9/2005 | Theobald et al. |
| 2009/0286065 A1 | 11/2009 | Bonifazi et al. |

OTHER PUBLICATIONS

Baldacchini et al., "Adsorption of pentacene on filled d-band metal surfaces: long-range ordering and adsorption energy", J. Chem. Phys., vol. 124, No. 15, pp. 154702-1 to 154702-7 (2006).
Barth, "Molecular architectonic on metal surfaces", Annu. Rev. Phys. Chem., vol. 58, pp. 375-407 (2007).
Bilic et al., "Adsorption of benzene on copper, silver, and gold surfaces", J. Chem. Theory Comput., vol. 2, No. 4, pp. 1093-1105 (2006).
Caldwell et al., "Self-assembled monolayer films of $C_{60}$ on cysteamine-modified gold", Langmuir, vol., pp. 1945-1947 (1993).
Canas-Ventura et al., "Self-assembly of periodic bicomponent wires and ribbons", Angew. Chem. Int. Ed., vol. 46, pp. 1814-1818 (2007).
Dameron et al., "Structures and displacement of 1-adamantanethiol self-assembled monolayers on Au{111}", J. Am. Chem. Soc., vol. 127, No. 24, pp. 8697-8704 (2005).
De Feyter and De Schryver, "Two-dimensional supramolecular self-assembly probed by scanning tunneling microscopy", Chem. Soc. Rev., vol. 32, pp. 139-150 (2003).
Delamarche et al., "Transport mechanisms of alkanethiois during microcontact printing on gold", J. Phys. Chem. B, vol. 102, pp. 3324-3334 (1998).
Diaz et al., "Redox active ordered arrays via metal initiated self assembly of terpyridine based ligands", J. Phys. Chem. B, vol. 105, pp. 8746-8754 (2001).
Duodevski et al., "Atomic force microscope imaging of molecular aggregation during self-assembled monolayr growth", Coll. Surf. A Phys. Eng. Asp., vol. 174, pp. 233-243 (2000).
Furukawa et al., "Structural transformation of a two-dimensional molecular network in response to selective guest inclusion", Angew. Chem. Int. Ed., vol. 46, No. 16, pp. 2831-2834 (2007).
Gooding et al., "Self-assembled monolayers into the $21^{st}$ century: recent advances and applications", Electroanalysis, vol. 15, No. 2, pp. 81-96 (2003).
Guo et al., "Scanning tunneling microscopy of surface-adsorbed fullerenes: $C_{60}$, $C_{70}$, and $C_{84}$", Surface Science, vol. 601, pp. 994-1000 (2007).
International Search Report from PCT Patent Application No.: PCT/GB2009/001701 mailed Nov. 18, 2009, now published as International Publication No.: WO 2010/004280 on Jan. 14, 2010.
Kampschulte et al., "Mediated coadsorption at the liquid-solid interface: stabilization through hydrogen bonds", J. Phys. Chem. B, vol. 109, No. 29, pp. 14074-14078 (2005).
Kongkanand and Kuwubata, "Preparations of metal islands using self-assembled monolayer technique", $206^{th}$ Meeting, The Electrochemical Society, Abstract No.: 1211 (2004).
Kramer et al., "Scanning probe lithography using self-assembled monolayers", Chem. Rev., vol. 103, pp. 4367-4418 (2003).
Li et al., "Supramolecular nanostructures of 1,3,5-benzenetricarboxylic acid at electrified Au(111)/0.05 M H2SO4 interfaces: an in situ scanning tunneling microsopy study", Langmuir. vol. 21, pp. 6915-6928 (2005).
Liu et al., "Nanofabrication of self-assembled monolayers using scanning probe lithography", Acc. Chem. Res., vol. 33, No. 7, pp. 457-466 (2000).
Love et al., "Self-assembled monolayers of thiolates on metals as a form of nanotechnology", Chem. Rev., vol. 105, No. 4, pp. 1103-1169 (2005).
Lu et al., "Template induced inclusion structures with copper(II) phthalocyanine and coronene as guests in two-dimensional hydrogen-bonded host networks", J. Phys. Chem., vol. 108, pp. 5161-5165 (2004).
Madueno et al., "Functionalizing hydrogen-bonded surface networks with self-assembled monolayers", Nature, vol. 454, pp. 618-621 (2008).
Maoz et al., "Nanoelectrochemical patterning of monolayer surfaces: toward spatially defined self-assembly of nanostructures", Advanced Materials. vol. 11, No. 1, pp. 55-61 (1999).
Mena-Osteritz and Bauerle, "Complexation of $C_{60}$ on a cyclothiophene monolayer template", Adv. Mater., vol. 18, pp. 447-451 (2006).
"Molecule" Definition of Molecule in Merriam-Webster Dictionary, retrieved from the internet: http://www.merriam-webster.com/dictionary/molecule, 6 pages, accessed on Feb. 9, 2013.
Mrksich, "A surface chemistry approach to studying cell adhesion", Chem. Soc. Rev., vol. 29, pp. 267-273 (2000).
Munakata et al., "Spatial distribution of domains in binary self-assembled monolayers of thiols having different lengths", J. Electroanalytical Chemistry, vol. 496, No. 1, pp. 29-36 (2001).
Oyamatsu et al., "Nanopore preparation in self-assembled monolayers of alkanethiols with use of the selective desorption technique assisted by underpotential deposit of silver and copper", J. Electroanal. Chem., vol. 497, No. 1-2, pp. 97-105 (2001).
Payer et al., "Ionic hydrogen bonds controllong two-dimensional supramolecular systems at a metal surface", Chem. Eur. J., vol. 13, pp. 3900-3906 (2007).
Perdicao et al., "Bimolecular networks and supramolecular traps on Au(111)", J. Phys. Chem. B, vol. 110, No. 25, pp. 12539-12542 (2006).
Pinhero and Temperini, "Pyridine and pyridine carboxylic acids as guests in a bidimensional hydrogen bond structure analyzed by scanning tunneling microscopy", Surface Science, vol. 601, pp. 1836-1843 (2007).
Salata, "Tools of nanotechnology: electrospray", Current Nanoscience, vol. 1, pp. 25-33 (2005).
Saywell et al., "Electrospray deposition of $C_{60}$ on a hydrogen-bonded supramolecular network", J. Phys. Chem. C, vol. 112, pp. 7706-7709 (2008).
Schenning and Meijer, "Supramolecular electronics: nanowires from self-assembled pi-conjugated systems", Chem. Commun., No. 26, pp. 3245-3258 (2005).
Schreiber, "Self-assembled monolayers: from 'simple' model systems to biofunctionalized interfaces", J. Phys. Condens. Matter, vol. 16, pp. R881-R900 (2004).
She et al., "Electron-beam patterned self-assembled monolayers as templates for Cu electrodeposition and lift-off", Beilstein Journal of Nanotechnology, vol. 3, pp. 101-113 (2012).
Silien and Buck, "On the role of extrinsic and intrinsic defects in the underpotential deposition of Cu on thiol-modified Au(111) electrodes", J. Phys. Chem., vol. 112, pp. 3881-3890 (2008).
Silien et al., "A supramolecular hydrogen-bonded network as a diffusion barrier for metal adatoms", Angew. Chem. Int. Ed., vol. 48, pp. 3349-3352 (2009).
"Solution", Definition of solution in Oford dictionary (British & World English), retrieved from the internet: http://oxforddictionaries.com/definition/english/solution, 2 pages, accessed on Aug. 28, 2013.
Spillmann et al., "A two-dimensional porphyrin-based porous network featuring communicatating cavities for the template complexation of fullerenes", Adv. Mater., vol. 18, No. 3, pp. 275-279 (2006).

(56) References Cited

OTHER PUBLICATIONS

Stepanow et al., "Steering molecular organization and host-guest interactions using two-dimensional nanoporous coordination systems", Nature Materials, vol. 3, pp. 229-233 (2004).

Stepanow et al., "Surface-assisted assembly of 2D metal-organic networks that exhibit unusual threefold coordination symmetry", Angew. Chem. Int. Ed. Engl., vol. 46, No. 5, pp. 710-713 (2007).

Stepanow et al., "Non-covalent binding of fullerenes and biomolecules at surface-supported metallosupramolecular receptors", Chem. Commun., No. 20, pp. 2153-2155 (2007).

Stohr et al., "Lateral manipulation for the positioning of molecular guests within the confinements of a highly stable self-assembled organic network", Small., vol. 3, No. 8, pp. 1336-1340 (2007).

Tahara et al., "Two-dimensional porous molecular networks of dehydrobenzo[12]annulene derivatives via alkyl chain interdigitation", J. Am. Chem. Soc. vol. 128, p. 16613-16625 (2006).

Theobald et al., "Controlling molecular deposition and layer structure with supramolecular surface assemblies", Letters to Nature, vol. 424, pp. 1029-1031 (2003).

Thom et al., "Replicative generation of metal microstructures by template-directed electrometallization", Appl. Phys. Lett., vol. 87, 24101-1 to 24101-3 (2005).

Weber et al., "Role of interaction anisotropy in the formation and stability of molecular templates", Phys. Rev. Lett., vol. 100, No. 15, Article 156101-1 to 156101-4 (2008).

\* cited by examiner

ND SURFACES

CROSS REFERENCE TO RELATED APPLICATIONS

This application is a divisional of U.S. application Ser. No. 13/003,213, filed Apr. 7, 2011, now U.S. Pat. No. 8,778,454, which is a U.S. National Stage application of International Patent Application No. PCT/GB2009/001701, filed Jul. 10, 2009, which claims the benefit of priority to GB Application No. 0812597.3, filed Jul. 10, 2008, each of which is hereby incorporated by reference.

FIELD OF THE INVENTION

The present invention relates to the processing of surfaces functionalised with a hybrid structure formed from (i) a molecular network defined by non-covalent interactions between molecules and (ii) a self-assembled monolayer. Such hybrid structures may be processed by modification and/or decoration, for example to yield surfaces having electronic, optical or other properties useful for a variety of applications.

BACKGROUND OF THE INVENTION

One of the central challenges in nanotechnology is the development of flexible and efficient methods for creating ordered structures with nanometer precision over an extended length scale. Supramolecular self-assembly on surfaces offers attractive features in this regard: it is a 'bottom-up' approach and thus allows simple and rapid creation of surface assemblies (De Feyter & De Schryver, *Chem. Soc. Rev.*, 2003, 32, 139-150; Barth, *Annu. Rev. Phys. Chem.*, 2007, 58, 375-407) which are readily tuned through the choice of molecular building blocks used and stabilized by hydrogen bonding (Theobald et al., *Nature*, 2003, 424, 1029-1031; Kampschulte et al., *J. Phys. Chem. B*, 2005, 109, 14074-14078), van der Waals interactions (Furukawa, *Angew. Chem. Int. Ed.*, 2007, 46, 2831-2834), π-π bonding (Mena-Osteritz & Bauerle, *Adv. Mater.*, 2006, 18, 447-451; Schenning & Meijer, *Chem. Comm.*, 2005, 3245-3258) or metal coordination (Diaz et al., *J. Phys. Chem. B*, 2001, 105, 8746-8754; Stepanow, *Nature Materials*, 2004, 3, 229-233) between the blocks. Assemblies in the form of two-dimensional open networks (Theobald et al., infra; Furukawa, infra; Mena-Osteritz & Bäuerle, infra; Stepanow, infra; Stöhr et al., *Small*, 2007, 3, 1336-1340; Spillmann et al., *Adv. Mater.*, 2006, 18, 275-279; Lu et al., *J. Phys. Chem. B*, 2004, 108, 5161-5165; and Stepanow et al., *Angew. Chem. Int. Ed.*, 2007, 46, 710-713) are particularly interesting for possible applications because well-defined pores can be used to precisely localize and confine guest entities such as molecules or clusters, which can add functionality to the supramolecular network.

Another widely used method for producing surface structures involves self-assembled monolayers (SAMs) (Schreiber, *J. Phys.: Condens. Matter*, 2004, 16, R881-R900), which have introduced unprecedented flexibility in providing ability to tailor interfaces and generate patterned surfaces (Gooding et al., *Electroanalysis*, 2003, 15, 81-96; Love et al., *Chem. Rev.*, 2005, 105, 1103-1170) But SAMs are part of a top-down technology limited in terms of the spatial resolution that it can usually afford.

Additionally, skills and methodology are known in the art that allow the creation of patterned organic layers on surfaces. These include microcontact printing, proximity printing, e-beam or ion beam lithography, photon-based patterning involving (photo) chemical reactions, and scanning probe lithographies. As with existing SAM methodologies, however, these additional top-down technologies are likewise only able to provide limited spatial resolution and/or are slow serial processes.

J. A. Theobald et al. (in *Nature* 424, 1029-1031(2003) and US 2005/0214471 A1) describe the production of two-dimensional nanoscale networks on the surface of a substrate formed by deposition of two different types of molecule. The formation of the network relies on the preferential heteromolecular hydrogen-bonding between unlike molecules over homomolecular interactions between like molecules. Resultant pores in the network are described as acting as containment vessels for guest molecules. The networks are described as being prepared under ultra-high vacuum (UHV) conditions (base pressure approximately $5 \times 10^{-11}$ torr), a method that is well-known to those skilled in the art.

WO 2008/006520 A2 describes a method for generating supramolecular rotary devices and a supramolecular rotary switch comprising providing a two-dimensional layer of self-organising molecules on an unstructured surface followed by further deposition of additional self-organising molecules/or other functional molecules on the two-dimensional layer, the further deposited molecules accommodating in so-called functional centres of cells defined by the two-dimensional layer. The molecules are described in this publication as having been vapour-deposited under UHV conditions on an atomically clean and flat Cu (111) surface.

Stepanow et al. (*Chem. Commun.*, 2006, 2153-2155) describe the preparation of so-called metallosupramolecular receptors that bind a single or discrete number of cysteine, $C_{60}$ or diphenylalanine molecules in which both the preparation of the two-dimensional metallosupramolecular receptors and the deposition of the guest species are undertaken under UHV conditions.

BRIEF SUMMARY OF THE INVENTION

The present invention arises from the recognition of advantages achievable from combining non-covalent self-assembling porous networks and SAMs on surfaces, in particular the network and SAM are deposited from liquids. This combination provides a powerful and versatile fabrication platform distinct from the description in the prior art of "guest capture" within cavities of surface-deposited porous networks. The use of these two different surface modification strategies allows the creation of integrated network-SAM hybrid systems that can be sufficiently robust to allow subsequent processing. In accordance with this methodology the non-covalent self-assembling porous networks provide nanometer-scale precision and the SAM brings versatility to the surface decoration.

It is particularly surprising, in the light of the prevalence in the prior art of deposition of porous networks from UHV environments, that the self-assembling (sometimes referred to herein as supramolecular or porous molecular) network and SAM components of the hybrid structure may be deposited from liquid media (e.g. from solution). Such simple, and so advantageous, deposition environments makes formation of the hybrid structures easier (obviating the need for conditions such as those under which UHV environments are achieved). Moreover, it broadens the versatility of the resultant structures and should enable widespread and flexible use of the invention.

Viewed from one aspect, therefore, the invention provides a method for producing a modified surface (5) comprising:

(i) patterning a surface (7) by forming thereon a porous molecular network (9) defined by non-covalent interactions between constituent molecules; and
(ii) depositing in said porous network (9) and on said patterned surface (11) molecules (13) so as to form a self-assembled monolayer (15), wherein both said patterning and said depositing are effected by contact with liquids.

Viewed from a second aspect there is provided a method for modifying a hybrid structure (5) comprised of (i) a surface (7) patterned with a porous molecular network (9) defined by non-covalent interactions between constituent molecules in said porous network and (ii) a self-assembled monolayer (15) adsorbed on said patterned surface (11), said method comprising controllably chemically modifying the porous molecular network (9) and/or the self-assembled monolayer (15).

By "controllably chemically modifying" is meant herein a modification which may be carried out whereby to provide a modified product having a predicable degree of functionalization and/or modification relative to the unmodified structure, which predicable degree of functionalization and/or modification is not uncontrolled destruction of the hybrid structure in existence before the controlled chemical modification.

Viewed from a further aspect there is provided a product obtainable according to either the first or the second aspects of the invention.

Other aspects and embodiments of the invention will be apparent from the discussion herein.

DETAILED DESCRIPTION OF THE INVENTION

Figure 1A:
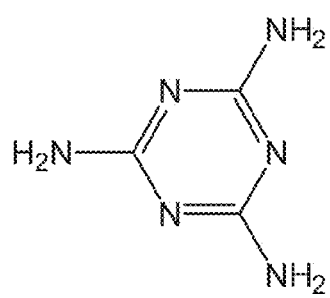
FIG. 1(a)-(d) shows the structures of melamine (FIG. 1(a)); PTCDI (FIG. 1(b)); and bonding motif (FIGS. 1(c) and (d)), FIG. 1(d) showing the schematic diagram of network with unit cell indicated by dashed rhombus.
Figure 1B:
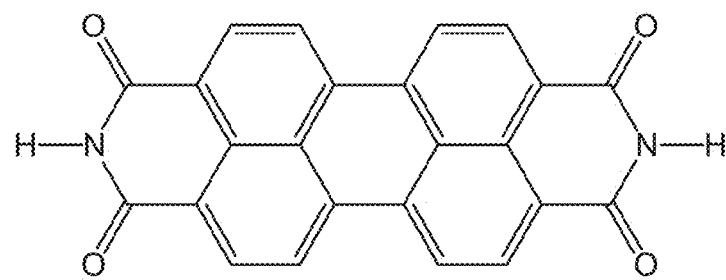

Surfaces (7) upon which the porous non-covalently bonded network is created, whereby to pattern it, may be a surface of any convenient material, referred to herein as substrate. The geometry of the substrate may also vary according to the requirements to which the hybrid structure is desired to be put. Thus the substrate may be a planar substrate with the hybrid structure coated upon one or both of its principal faces; spherical structures with the hybrid structure coated thereon; tubular structures with the hybrid structure coated on the inside and/or the outside of the tubes and other shapes and forms.

Conveniently, substrates (7) upon which it is desired to form the hybrid structures (5) of this invention may be thin layers typically of the order of 100-500 nm, e.g. 150-300 nm. Bulky material (i.e. not thin layers) may also be used, e.g. single crystals of substrate of ca. 0.5 to 5 mm thick single crystals, or 0.5 to 1 mm thick silicon wafers. The substrate (7) may be supported upon any convenient support formed of either the same material as or different material to that of the substrate. The substrate, when supported, or otherwise, need not necessarily be as thick as 100 nm. Generally it is desirable to have a substantially continuous surface of the substrate (i.e. one that is not grainy on a nm length scale and this may be achieved at thickness of less than 100 nm. The substrate may be, for example, made of glasses such as silicates and borates, or conductors (e.g. metals) or semi-conductors such as gold, silver, chromium, manganese, vanadium, tungsten, molybdenum, zirconium, titanium, platinum, aluminium, iron, steel, silicon, indium phosphide, gallium arsenide and alloys and mixtures thereof. The substrate can thus be a semiconductor such as silicon, gallium arsenide or titanium dioxide. The substrate may also be an insulator, e.g. silicon dioxide or aluminium oxide ($Al_2O_3$). Typically as described hereinafter, the substrate will generally not be chosen in isolation, the choice of substrate (7) influencing both the strength of binding of the porous molecular network (9) and self-assembled monolayers (15) to be bound thereto.

Supported metallic layers may be conveniently prepared by a variety of means as known by those skilled in the art such as by physical vapour deposition methods (including thermal or electron beam evaporation), sputtering and electro deposition or electroless deposition.

Typically the metallic substrate is formed of gold, silver, copper, vanadium, platinum, palladium or nickel, more particularly gold.

The first step involved in the preparation of the hybrid structures (5) according to this invention is to adsorb to the surface of the substrate (7) a molecule or molecules capable of forming the desired extended two-dimensional porous molecular network (9). This part of the method of the invention serves to provide an otherwise homogeneous surface with a desired pattern, in a predictable way. Patterning of surfaces may be achieved in this way by making use of non-covalent directional interactions between common or different molecules. Formation of such a network may be achieved in any convenient way as is known in the art. Thus, for example, formation of the network may be in accordance with the description of US 2005/0214471 A1 (infra), typically forming the network by contacting the substrate with the constituent molecules from which the network is formed, whereby the two-dimensional network is provided by depositing on the surface of the substrate a so-called "sub-monolayer" of molecule A followed by a different molecule B. Stronger heteromolecular hydrogen-bonds between molecules A and B (as opposed to homomolecular bonding between like molecules) drive network formation of the network. As is known in the art, the network can be formed by virtue of hydrogen-bonds, van der Waals interaction or π-π bonding or metal coordination between the different types of molecule. It will be appreciated that the (different) molecules that provide the network may be provided in a single step or may each be present in two or more separate steps whereby they adsorb on the surface of the substrate to provide the desired molecular network.

As will be understood, the precise identity of the components that form the molecular network (9) is not crucial. The purpose of this part of the method is merely to provide a pre-determined (primarily by the nature of the molecules) and controllable deposition of a pattern onto substrate.

The nature of the molecules that form the network (9) may be determined by a number of factors, for example the strength of interaction with each other and the strength of interaction with the substrate (7). In general, any molecule or combination of molecules that exhibit sufficiently strong intermolecular interactions can be used. A feature of the present invention arises from a recognition that selection of the constituent molecule(s) from which the network is formed in combination with selection of the substrate and selection of the molecules (13) that form the SAM (15) give rise to hybrid structures that may be modified, in particular in liquid media.

Figure 1C:
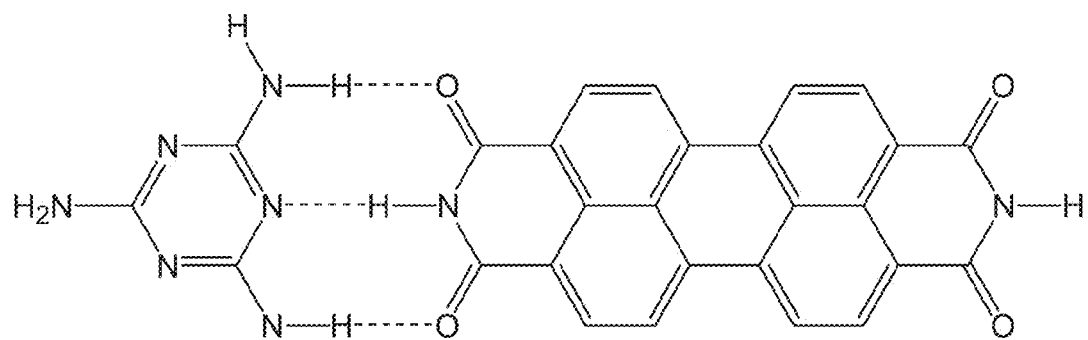
Figure 1D:
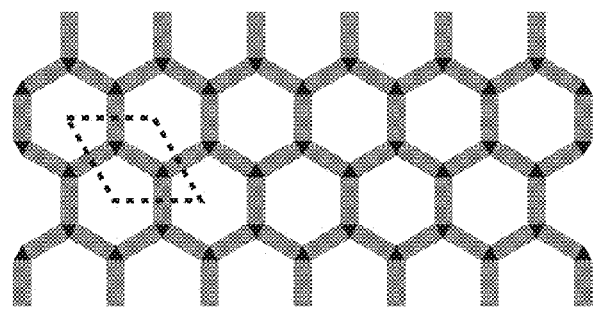

An example of a pair of unlike molecules that can afford a desired surface patterning effect is perylene tetra-carboxylic di-imide (PTCDI) and 1,3,5-triazine-2,4,6-triamine (melamine). As depicted in FIG. 1(c), these molecules interact with each other via three hydrogen bonds. The three-fold and two-fold symmetry of melamine and PTCDI respectively, gives rise to a hexagonal network as shown schematically in FIG. 1(d). This bi-molecular network is, advantageously, particularly flexible because the resultant pore size can be varied in a controllable fashion by using analogues of PTCDI (such as analogues of naphthalene, terrylene, and quaterrylene and coronene) and functionality by adding side-groups (e.g. fullerenes, aliphatic or aromatic moieties, amino acids, metal-organic or organometallic moieties and others, such as fullerenes, aliphatic or aromatic moieties, amino acids, organometallic moieties and others) to the aromatic rings in particular. Functional groups, such as carboxylic acids, aldehydes, ethers, amino groups, amides, alcohols and cyano groups, may be introduced in this way. As will be recognised by the skilled person, naphthalene-, terrylene-, quaterrylene- and coronene-based analogues of PTCDI are analogues of PTCDI in that the naphthalene, terrylene, quaterrylene and coronene are functionalised, analogously to PTCDI, with two fused six-membered rings each comprising the diradical —C(=O)N(H)C(=O)— joined to two carbon atoms of naphthalene, terrylene, quaterrylene and coronene.

As is evident from FIG. 1(c) in particular, melamine provides a suitable counterpart to PTCDI to provide for the formation of the three hydrogen bonds depicted. However, the skilled person will understand that analogues of melamine could be used comprising the functional unit that participates in the hydrogen-bonding network, i.e. (H$_2$N—C—N—C—NH$_2$). Such analogues of melamine are described herein as higher homologues of melamine.

Examples of higher homologues of melamine are known to and at the disposal of those skilled in the art. They include, for example, 4,4',4"-(1,3,5-benzenetriyl)tris-2,6-pyridinediamine described by Theobald et al. (in Nature 424, 1029-1031(2003) and US 2005/0214471 A1, both infra; see in particular compound 5 in FIG. 2 of US 2005/0214471 A1):

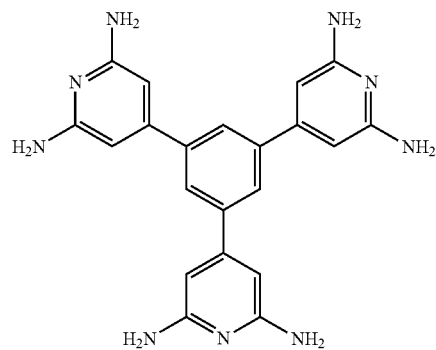 [SMILES: Nc1cc(-c2cc(-c3cc(N)nc(N)c3)cc(-c3cc(N)nc(N)c3)c2)cc(N)n1]

as well as variants thereof, for example wherein the central benzene ring is substituted with a different aromatic or other cyclic system, in particular an aromatic system optionally allowing a different number (than 3), e.g. 2 or 4, in particular 4, of the 2,6-diaminopyridyl (or other H$_2$N—C—N—C—NH$_2$-containing) moieties to be attached. In such homologues, one or more spacer units, such as alkynylene, bis (alkynylene) or arylene diradicals, may be interposed between the central unit in the homologues (i.e. the benzene ring or other aromatic or other cyclic system) and pendant 2,6-diaminopyridyl (or other H$_2$N—C—N—C—NH$_2$-containing) moieties. An example of such a variant is compound 10 in FIG. 2 of US 2005/0214471 A1):

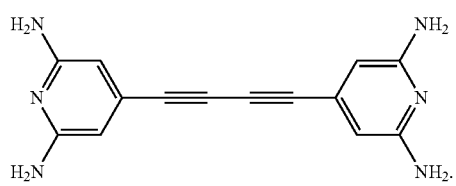

A further example of higher homologue of melamine is the compound

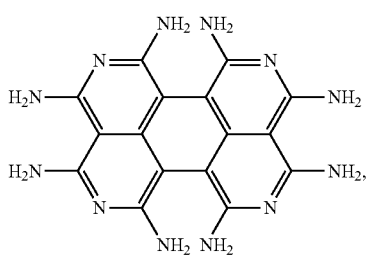 [SMILES: Nc1nc(N)c2c3c(N)nc(N)c4c(N)nc(N)c(c5c(N)nc(N)c1c25)c43]

which comprises four of the docking H$_2$N—C—N—C—NH$_2$ units.

The syntheses of all such higher homologues of melamine as described herein are well within the ability of those skilled in the art.

It is the presence of a plurality of hydrogen bond donors and/or acceptors that provides for the formation of a two-dimensional network across the surface of the substrate. Thus, for example, a molecule exhibiting four of the functional units in melamine (H$_2$NC—N—C—NH$_2$), and exhibiting a four-fold axis of symmetry, will enable the construction of rectangular, for example, square pores, instead of the hexagonal pores resultant from the use of PTCDI and melamine. The ability to tailor the pore size by the judicious selection of the constituent molecules from which the molecular network is defined is an advantageous feature of this invention.

From the foregoing, therefore, it will be appreciated that the specific hydrogen-bonding motif depicted in FIG. 1(c) is but a single example. Others are possible, such as that depicted schematically in FIG. 1(f) in which each of the arbitrarily positioned substituents R$^1$ and R$^2$ serve to indicate that an additional organic moiety, for example but not limited to benzene-, perylene-, coronene- and phthalocynine-containing moieties could be present. Such moieties may then participate in addition hydrogen-bonding interaction (for example of the type indicated in FIG. 1(c)), the number, position and nature of such substituents being selected on the basis of the nature of the porous molecular network (9) desired. In principle, any hydrogen-bonded motif may be used to construct the molecular network according to the present invention, with the hydrogen bonding motif possibly being made up of amino, imino, keto, hydroxyl or carboxylic acid groups, amongst other groups evident to the skilled person.

The advantageous features (in particular) of the PTCDI and melamine molecules and analogues thereof are the presence of both aromatic moieties capable of interacting strongly with metallic substrate, such as gold, as well as moieties that allow a strong interaction between molecules, whereby to form the network. Typically these moieties give rise to a strong hydrogen-bonding network resulting from a plurality of hydrogen bonds between molecules although other interactions may also arise between constituent molecules.

As an alternative to the use of melamine and PTCDI, or analogues thereof, to provide the desired surface patterning effect, molecules such as porphyrins, coronenes and phthalocyanines, and derivatives thereof may be used to form planar molecular network structures when functionalised as described in WO 2008/006520 (infra). As is described in this publication, network structures may be formed in this way from a single type of molecule such as a porphyrin derivative. Other molecular building blocks, such as dehydro-benzo[12]annulene derivatives, may be used to construct the two-dimensional molecular network as described, for example, by S. Furukawa et al. (*Angew. Chem. Int. Ed.* 2007, 46, 2831-2834). Other means of forming molecular networks by adsorption onto substrates, and appropriate compounds therefore, are known to and at the disposal of those skilled in the art.

Typically, in the prior art, as alluded to hereinbefore, construction of the molecular network on substrates is achieved in UHV environment. This restricts assembly to molecules susceptible to sublimation and can make additional processing of the resultant network difficult. In contradistinction, we have found that it is generally possible though not necessary according to all aspects of this invention to manufacture the porous network by a liquid-based fabrication strategy, as well as by the UHV processing practiced hitherto. It is the recognition of this possibility in particular that spurred us to investigate and achieve the subsequent addition of SAMs onto the patterned substrate provided by deposition of the porous two-dimensional network.

As we describe below, in the experimental section, the liquid-based deposition of PTCDI/melamine network onto gold has been achieved from a solution of dimethylformamide (DMF). It will be appreciated that any convenient liquid for the component(s) serving to give rise to the porous network may be used in place of DMF.

Thus other organic liquids such as dimethylsulfoxide (DMSO), toluene and others, or water and water-containing liquids, where appropriate, may be used in place of DMF. In particular embodiments of this invention deposition onto the substrate of the molecules that afford the network is achieved from solution. However deposition may also be achieved by deposition from dispersions, suspensions or emulsions of the molecules.

Figure 1E:
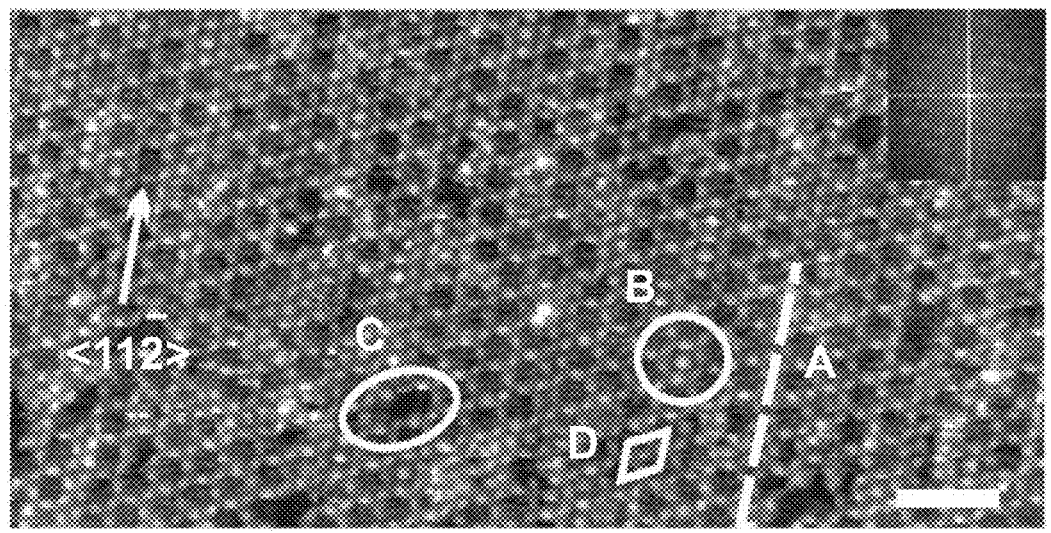
FIG. 1(e) shows a STM image of supramolecular network of melamine-perylene tetra-carboxylic di-amide (PTCDI) self-assembled on Au(111) recorded in ambient. Dashed line A highlights a fault line. Circled areas B and C mark a pore hosting a PTCDI molecule and a missing PTCDI molecule, respectively. The (7√3×7√3) R30° unit cell (D) corresponding to a 35 Å period of the honeycomb is also indicated. Inset shows Fourier transform. Scale bar: 10 nm.
Figure 1F:
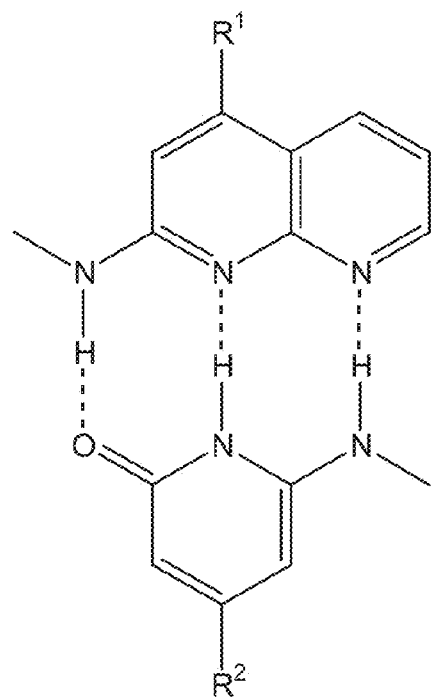
FIG. 1(f) shows an alternative bonding motif.

We have found that a particular advantage of the liquid-based deposition is that it is possible to provide an extended two-dimensional porous molecular network, in contrast to the 50% coverage reported by J. A. Theobald et al. (infra). Indeed, the network structure overall is very regular. An STM of a melamine-PTCDI network is shown in FIG. 1(e), which shows that there are no major discontinuities but some imperfections are discernible. The first one, highlighted by the dashed line A in FIG. 1(e), is a fault line with neighbouring hexagons meeting at a vertex instead of sharing an edge. The second one is an additional PTCDI molecule trapped in a pore (marked by ellipse B). A third one is a missing PTCDI molecule (ellipse C in FIG. 1(e)), thus, joining two adjacent cells. However, these are exceptions to the overall pattern of the surface, rather than the coverage of the surface by the pattern, the coverage being essentially continuous.

The liquid-based preparation makes the network a readily accessible template, but the scope for further modification and use depend on its stability under the conditions of subsequent processing, in particular modification with SAMs. We have found that the supramolecular network structure of the invention exhibits sufficient stability to act as a template for the adsorption onto the pattern defined by it whereby to provide the hybrid structure.

By SAM herein is meant a layer that self-assembles on a surface. The assembly is a monolayer because it is formed of a plurality of (usually organic) molecules that have a particular affinity, in a portion of their structure commonly referred to as a headgroup, for the surface on which they assemble. It is the interaction of the headgroup with the surface that leads to formation of the monolayer. The skilled person is familiar with which types of headgroup bind to any particular surface, for example which headgroup best binds to a specific metal and reference in this regard is made to the extensive discussion of the use in nanotechnology of self-assembling monolayers (of thiolates in particular) on metals by J. C. Love et al. (*Chem. Rev.*, 2005, 105, 1103-1169) and in particular the discussion therein of exemplary combinations of headgroups in substrate used in forming SAMs on metals, oxides and semiconductors (see Table 1).

The headgroups may conveniently be thiols, the molecules providing the SAMs typically being organothiols, i.e. of formula R—SH where R is an organic moiety. For details see J. C. Love et al. (infra). As is known in the art, disulfides can also be used to provide SAMs as well as selenium containing analogues of thiols and disulfides. Other headgroups are known to those skilled in the art and include phosphonates, carboxylic acids, silanes and other functional groups, e.g. phosphates and sulfonic acids, capable of forming a covalent or ionic bond, e.g. a covalent bond, to the substrate such as e.g. OH or unsaturated C—C bonds. In order to form the SAM layer onto the patterned surface, the molecules that form the SAM may be dissolved, emulsified or dispersed in any convenient liquid whereby to form an appropriate solution, emulsion or dispersion. Typically, the molecules will be dissolved whereby to form solutions, e.g. of concentrations between about 1 nM and 1 M, e.g. between about 1 µM and 100 mM, more particularly from about 0.01 to 10 mM. The appropriate liquid will be dependent upon the molecule concerned and can be selected by the skilled person. For example, thiols may be appropriately dissolved in organic solvents, e.g. alkanols, for example methanol, ethanol, isoproprananol, or mixtures thereof. Contact times typically vary between about 1 second and 24 hours. After formation the resultant hybrid structure may be rinsed, generally with more of the same solvent in which the molecules forming the solution etc. were dissolved, followed by drying. Drying may be achieved by air-drying, blowing air or inert gas over the structures or by other ways, for example drying in an oven at a suitable temperature, optionally under reduced pressure.

The hybrid structures of the invention are stable in a liquid environment in which they may be formed and can be processed further. For example, the SAM portion of the hybrid structure may be modified so as to tailor the surface functionality displayed by the SAM to provide surfaces useful for various applications. Reference is made to the review of J. C. Love at al. (infra) for various methodologies known in the art for modifying SAMs.

The hybrid structures described herein may be prepared by liquid-based techniques described herein. Alternatively they may be prepared in other ways, for example under UHV conditions. Regardless of how they may be prepared, however, the hybrid structure may be modified to afford specifically modified substrates. This is achieved by controlled chemical modification of the hybrid structures described herein by which is meant a process whereby the hybrid structure is altered in a non-destructive manner and in which the modification is specific to a particular portion of the hybrid structure. For example, it is possible to effect electrochemical metal deposition in a potential range where a monolayer of metal may be deposited known as underpotential deposition (UPD), (effected at a potential more positive compared to one where bulk metal deposits) resulting in the intercalation of the metal (19) at the SAM-substrate interface (21) (shown pictorially in step 1 of FIG. 5). For example, if copper is deposited on a SAM/Au sample the R—S—Au bonding is replaced by R—S—Cu—Au. The consequence of this intercalated is that the bonding of thiol (or other molecules giving rise to a SAM) can become stronger. For example, if copper or silver are intercalated between a SAM and a gold substrate, the thus-modified interface increases stability of the SAM-decorated substrate.

Whilst UPD on gold-supported thiols is typically practised with copper or silver intercalation, intercalation of other metals or non-metals is possible where the bonding of the thiol or other molecule making up the SAM to the substrate is weaker than its bonding via an intercalated material.

A particular advantage of the present invention is that the geometry of the hybrid structure allows targeted chemical modification of either the SAM or the macromolecular network through the pattern of which the SAM is adsorbed to the underlying substrate. In other words the patterning of the molecular network into which the SAM is deposited means that the resultant SAM formed is also patterned. An example of this is the UPD of metals described hereinabove. Whilst UPD of metals on metal-supported self-assembled monolayers is known, it has hitherto been a problem to confine this deposition laterally (C Silen and M Buck, *J. Phys. Chem.*, 2008, 3881-3890), because SAMs have typically been present over the whole surface providing essentially homogenous extended regions of SAM. With respect to nanotechnology, i.e. the generation of nanometer (i.e. typically in which one dimension is less than 100 nm) scaled patterns, this is a serious limitation as the inability control the pattern of deposited metal reaches its resolution. This may be contrasted with the SAM present in the hybrid structure according to this invention since there is strict demarcation between "islands" of SAM provided by the underlying network in the pores of the network within which the SAM molecules sit. Thus, when subjected to UPD, the metal or other material intercalated into, for example, the Au—S bond, is confined to those areas of the substrate on which the SAM is present.

Moreover, not only does the UPD on the SAM-network hybrid system avoid intercalation over extended areas of SAM as in the prior art, because the network acts as a barrier to the diffusion of intercalated metal, UPD proceeds very quickly as a consequence of the gaps between the SAM islands. Furthermore, UPD of an extended layer of SAM previously would correlate with the defects in the epitaxiality of the SAM deposition on the substrate. In contrast, the regular structure of the hybrid structure of this invention may be considered to be a series of well-defined defects (i.e. defined by the gaps between the SAM islands), which greatly facilitate UPD making it more controllable.

Separately, and as an alternative to or in addition to any intercalation chemistry conducted at the interface of the SAM and the substrate, it is possible to effect chemistry on the "tails" of the molecules forming the SAM whereby to, for example, functionalise these portions of the SAM-forming molecules. Thus, nanometer-sized objects (29) may be introduced to sit on top of the SAM islands, for example by introducing chemical functionality into the tails of the molecules that provide the SAM. Different ways to introduce such objects (29) are depicted schematically as the product of steps 2 shown in FIG. 5. An example is the attachment of oligonucleotide (such as DNA or RNA) or proteins. Alternatively, functionality may be present in the tails (25) allowing coordination of metal ions to the top of the SAM island. Electrochemical reduction of the ions to atomic metal may be effected which resultant metal atoms can aggregate to nanometer-sized clusters (29). Such clusters can be advantageous in various electronic applications such as those based upon quantum dot technology (Oncel et al, J. Chem. Phys., 2005 123, 044703/1-4, Shekhah et al., *PCCP* 2006, 8, 3375-3378).

Figure 5A:
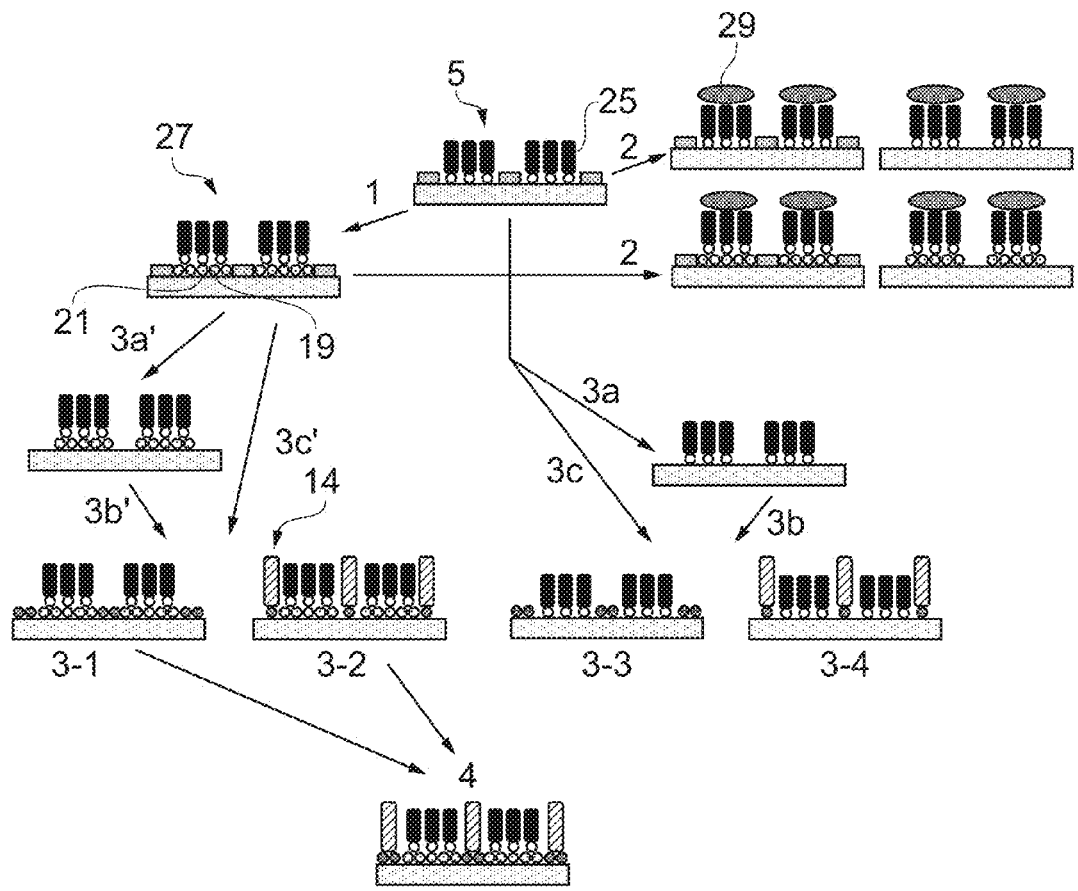
FIG. 5(a) shows, a scheme of possible modification pathways of molecular hybrid structures.
Figure 5B:
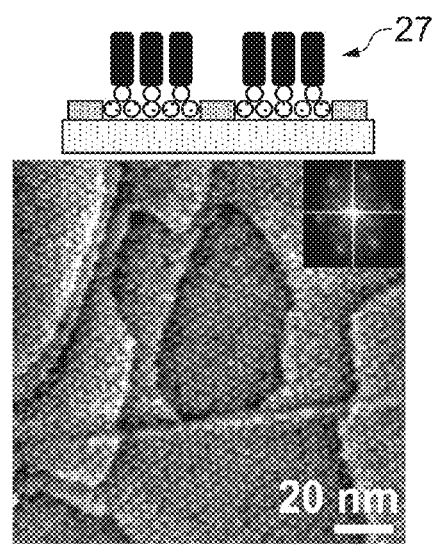
FIG. 5(b) shows (27) an example of modification of a hybrid structure. Metal is electrochemically deposited in the pores at the metal-SAM interface (21) (reaction 1 in FIG. 5(a)).

With regard to modification of the macromolecular network (5), this is depicted in steps 3 of FIG. 5. One way in which the network (9) may be displaced, if this is desired, is by its substitution, i.e. replacement, with one or more type(s) of molecules (14) that may form self-assembled monolayers.

These second or subsequent molecules (14) need not be (and advantageously are not) the same molecules as those (13) which provide the SAM islands (15) occupying the pores of the macromolecular network (9) nor even have the same headgroups (23) as those molecules (13). If the macromolecular network is displaced in this way, the resultant modified substrate (3-2, 3-4, 4) comprises a substrate (7) decorated with the original SAM (15), in which the gaps between the SAM islands of the initial hybrid structure are filled with the species (14) that served to displace the network molecules. Since the original network defines where the additional species (14) are located, such displacement method allows for the generation of very exactly patterned SAM-decorated surface (see structures 3-2 and 3-4 (and 4) of FIG. 5) since the network serves as the pattern for the initial layer of SAMs on an extended area, its displacement may be regarded as a massively parallel yet easily achievable process. This may be contrasted with the process in the prior art in which the generation of patterned SAMs at this degree of resolution (i.e. less than 100 nm and in particular less than 10 nm) requires cumbersome, time-consuming serial techniques (such as scanning probe microscopy) which are both harder to control and not applicable to extended areas and non-flat substrate geometries.

As an alternative to displacement with a species that is also a type of molecule susceptible to the formation of a SAM, network displacement may be effected by electrochemical deposition of metal or other metals leading to the structures 3-1 and 3-3 shown in FIG. 5.

Displacement of the network can either take place on a hybrid structure that has not been subject to intercalation by, for example, UPD whereby it has stabilised the substrate-SAM molecule interactions (see routes 3$a$-$c$ of FIG. 5) or on a hybrid structure on which the SAM islands have been stabilised by UPD metal intercalation (see routes 3$a'$-$c'$ of FIG. 5). Also, a displacement of the network may be by a "direct" process as depicted in routes 3$c$ and 3$c'$ of FIG. 5 or by sequential displacement shown by routes 3$a$ & $b$ and 3$a'$ & $b'$ of FIG. 5.

Further modifications of the hybrid structures are shown by the arrows leading to structure 4 in FIG. 5. The arrow leading from structure 3-1 to structure 4 depicts the adsorption of molecules onto metal deposited in step 3$b'$; the arrow pointing from structure 3-2 may afford the same structure but as a result of, for example, UPD of a metal beneath a second type of SAM molecule introduced in direct substitution route 3$c'$.

Whether the molecules that form the SAM in the SAM-modified structure of the macromolecular patterned substrate serve as active sites for precise localisation of species through chemical interactions, or whether they are used to block such interactions, whereby for example to direct further molecules to the network molecules themselves (since these are not covered by the molecules that form the SAM), the hybrid system can provide control on a scale and at a precision not readily achievable otherwise. By accessing the hybrid systems through exclusively liquid-based processing in particular, according to certain embodiments, facilitates a wide range of fundamental studies into confined nanometer-sized geometries can influence phenomena as diverse as electrochemistry, tribology or wetting.

An example of the further proccessability of the hybrid structure of this invention is the electrochemical deposition of copper in the under potential deposition (UPD) region as described below.

The invention may be further understood with reference to the following non-limiting examples:

General

FIG. 1($e$) is despeckled, all other STM images are presented as acquired.

EXAMPLE 1

Formation of Hybrid Structure

PTCDI (Alfa Aesar, 98+%) and melamine (Sigma-Aldrich, 99.9%) were used without further purification. The PTCDI/melamine mixture used for the experiments was prepared from saturated solutions of PTCDI and melamine in dimethyl formamide (DMF) which were diluted, typically by factors of 25 and 4 for PTCDI and melamine, respectively. Au/mica substrates (300 nm Au, G. Albert PVD) were flame annealed prior to immersion into the PTCDI/melamine solution. Immersion times for network formation were up to 3 min at temperatures varying from 325 and 400 K with 1 min and 371 K as a typical combination of parameters. After removal from solution samples were blown dry in a stream of nitrogen or argon. The STM image of the resultant network in FIG. 1$e$ reveals the honeycomb arrangement of the PTCDI molecules, which are the moieties resolved on this scale. The period of the honeycomb is 35 Å which corresponds to a $(7\sqrt{3} \times 7\sqrt{3})$ R30° unit cell (Perdigao, L. M. A. et al $J$. $Phys$. $Chem$. $B$ 2006, 110, 12539-12542 (2006)). In contrast to the 50% coverage observed in an earlier UHV experiment (Theobald et al., $Nature$, 2003, infra), we find that the network forms over extended areas.

A precise estimation of network stability under relevant conditions is not possible, due to the lack of precise data for the network, in particular for the adsorption energies of PTCDI and melamine. But we can use the hydrogen bond energy per synthon (values range from 70 kJ/mol (Weber et al., $Phys$. $Rev$. $Lett$. 2008, 100, 156101/1-4) and 90 kJ/mol (Aakeroy, C. B. & Seddon, $Chem$. $Soc$. $Rev$. 1993, 22, 397-407) to calculate total network binding energies of 140-180 kJ/mol and 210-270 kJ/mol per PTCDI or melamine molecule, respectively. The adsorption energies of PTCDI and melamine are taken to be similar to those of other aromatic hydrocarbons (Baldacchini, C., Mariani, C. & Betti, M. G. $J$. $Chem$. $Phys$. 2006, 124, 154702/1-7; Bilic, A., Reimers, J. R., Hush, N. S., Hoft, R. C. & Ford, M. J. $J$. $Chem$. $Theory$ $Comput$. 2006, 2, 1093-1105), which range from 50 to 200 kJ/mol. With this approach, we estimate the binding energy of a network molecule to fall in the range of 200-470 kJ/mol, which is higher than the 160-200 kJ/mol of an Au—S bond (Schreiber, F. $J$. $Phys$.: $Condens$. $Matter$ 2004, 16, R881-R900; Love, J. C., Estroff, L. A., Kriebel, J. K., Nuzzo, R. G. & Whitesides, G. M. $Chem$. $Rev$. 2005, 105, 1103-1170). But considering that more than one thiol molecule can be adsorbed in the area occupied by PTCDI and melamine, we conclude that thiol adsorption can energetically match the network.

To investigate to what extent thiols can be adsorbed into the network we chose three types of molecules (see FIG. 2$b$)) which differ in the stability of the respective SAMs. One is small and rigid and has rather weak intermolecular interactions (adamantane thiol, ASH) (Dameron, A. A., Charles, L. F. & Weiss, P. S. $J$. $Am$. $Chem$, $Soc$., 2005, 127, 8697-8704); the other two exhibit more pronounced intermolecular interactions, one of these consisting of a rigid aromatic moiety combined with an aliphatic spacer (ω-(4-methylbiphenyl-4-yl)propane thiol, BP3SH) and the other of a flexible alkane chain (dodecane thiol, C12SH).

For thiol adsorption experiments network/Au/mica samples were immersed in a 1 mM solution of the respective thiol (adamantane thiol (ASH): Sigma-Aldrich, 99.9%, dodecane thiol (C12SH) Sigma-Aldrich, 98+%, ω-(4'-methylbiphenyl-4-yl)propane thiol (BP3SH), synthesis see ref. 43 in *J. Phys. Chem.* C, 2008, 112, 3881) in ethanol at room temperature. Immersion times were varied between 3 s and 24 h. After immersion, samples were thoroughly rinsed with ethanol and blown dry with N2.

Figure 2A:
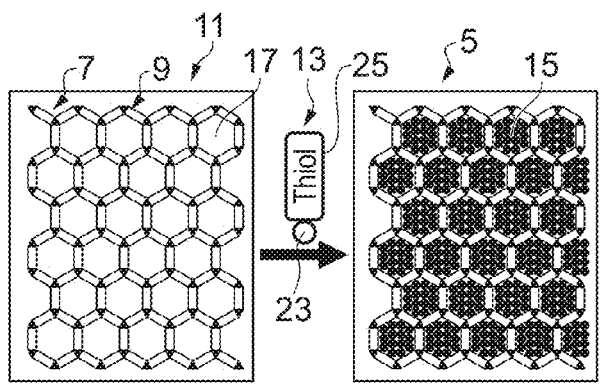
FIG. 2(a) shows schematically generation of a network-SAM hybrid structure (5) by a scheme of filling the cells (17) of the PTCDI-melamine network (9) by thiols (13)
Figure 2B:
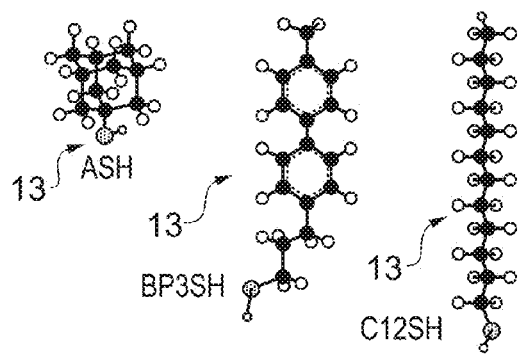
FIG. 2(b) shows structures of three different thiols (13) studied.
Figure 2C:
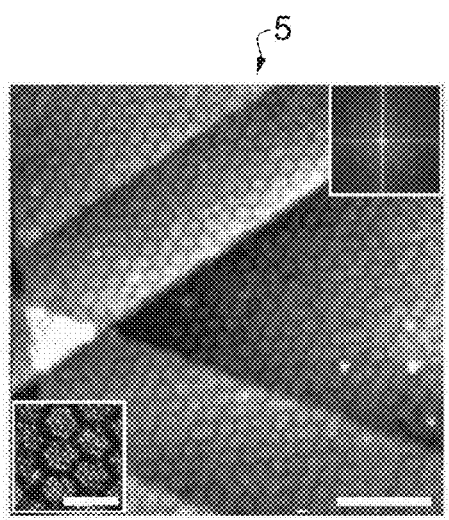
FIG. 2(c) to (e) are STM images of hybrid structures on Au(111)/mica in which the network (9) is filled with adamantane thiol (ASH) (in FIG. 2(c)), dodecane thiol (C12SH) (in FIG. 2(d)) and ω-(4'-methylbiphenyl-4-yl)propane thiol (BP3SH) (in FIG. 2(e)). Insets at lower left and upper right corners of STM images show high resolution images and Fourier transforms, respectively. Scale bars: 20 nm for large scale images, 5 nm for insets.
Figure 2D:
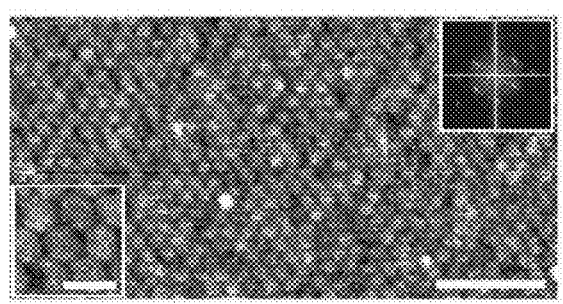
Figure 2E:
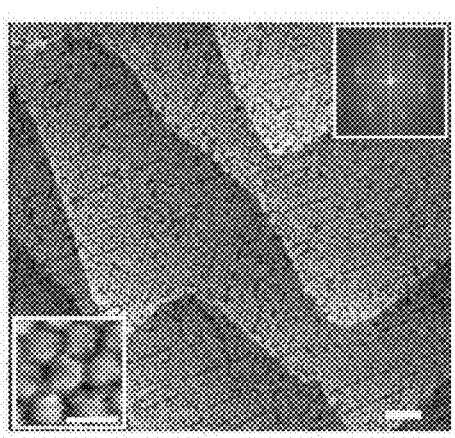

Large-scale STM images of the resultant structures (FIG. 2(c), (d), (e)) show that the network acts as template for all three types of molecules, with high-resolution images and Fourier transforms (see insets) confirming that in all cases the hexagonal pattern is well maintained after thiol adsorption. In contrast to the empty network where the molecules appear as protrusions (FIG. 1), filling the network pores inverts the height contrast so that the presence of the network is reflected by the appearance of hexagonal grooves. It is worth noting that due to the rigidity of adamantane thiol it was even possible to achieve molecular resolution (inset of FIG. 2(c)).

FIG. 2 demonstrates that the supramolecular network serves as a general template for a range of thiol molecules that form SAMs differing substantially in structure, intermolecular interactions and stability. But we note that the details of the preparation protocol relate to the SAM molecule used, and reflect the above estimated similarity of SAMs and network with respect to their energetics. In the case of adamantane thiol, which is known to form SAMs that are not very stable (compared to SAMs formed from e.g. alkane thiols), immersion time is not critical: the pores of the network are filled within seconds, and the network itself is perfectly stable against displacement by ASH. In contrast, in the case of the other two molecules, prolonged exposure of the network to a solution of the respective thiol molecules ultimately results in the displacement of the network and formation of a uniform SAM. However, there is a pronounced difference between the rate at which the pores are filled and the rate at which the network is displaced, so that selective adsorption in the pores while maintaining the network structure can be kinetically controlled as evidenced by FIG. 2.

EXAMPLE 2

Electrochemical (UPD) Deposition of Copper onto Hybrid Structure

Partial Cu UPD was achieved in 50 mM $CuSO_4$/0.5 μM $H_2SO_4$ (aqueous) by setting the sample potential at +100 mV versus $Cu/Cu^{2+}$ for 10 sec in a PTFE electrochemical cell. The sample was then rinsed with deionised $H_2O$ and blown dry with $N_2$. Complete Cu UPD coverage was achieved by repeating the same procedure once.

Figure 3A:
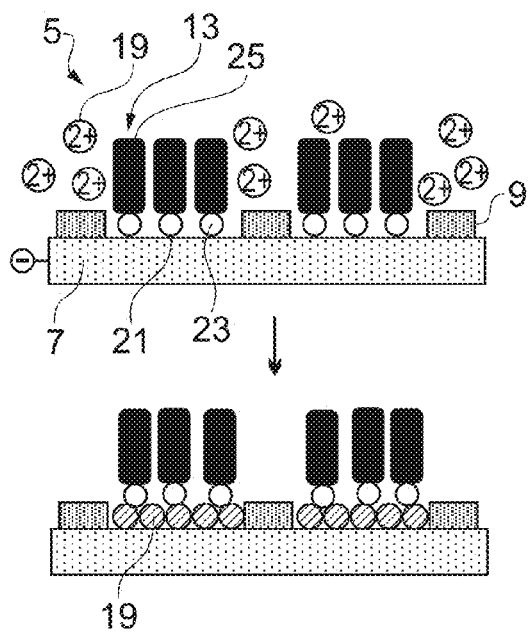
FIG. 3(a) shows schematically the under potential deposition (UDP) of Cu (19) on Au(111) (7) modified by an ASH (13)-filled PTCDI-melamine network (9), showing illustration of electrochemical Cu deposition in pores (17) of network at the thiol/Au interface (21).
Figure 3B:
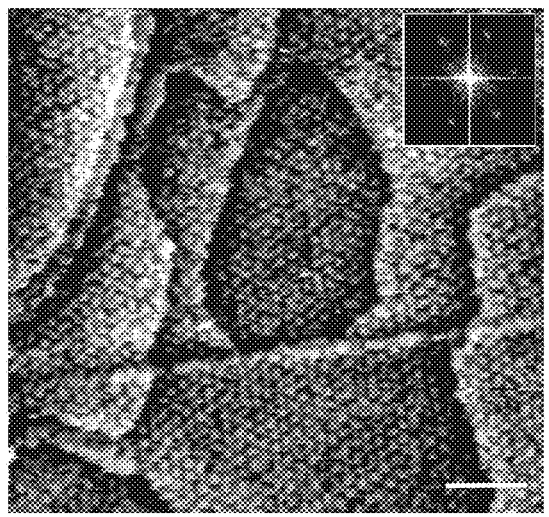
FIGS. 3(b) and (c) show STM images of samples taken in ambient atmosphere after complete (b) and partial (c) Cu UPD. Scale bars: 20 nm. Arrows in FIG. 3(c) mark isolated cells of Cu UPD.

The experiment shown schematically in FIG. 3(a) involves a sample with a SAM/network hybrid structure mounted in an electrochemical cell containing $Cu^{2+}$ ions. A potential in the UPD region of Cu (i.e., positive of the Nernst potential) is then applied, which causes insertion of a monolayer of Cu between the Au substrate and the thiol molecules (Silien, C. & Buck, M., *J. Phys. Chem. C* 112, 3881-3890(2008)). The Cu insertion renders the thiol/substrate bond more stable and could be used for further patterning (Oyamatsu, D., Kanemoto, H., Kuwabata, S. & Yoneyama, H., *J. Electroanal. Chem.* 497, 97-105 (2001)). After deposition, the sample was removed from the cell and investigated by STM in ambient environment, with the image (FIG. 3(b)) revealing that the pattern of the hybrid structure is preserved.

Figure 3C:
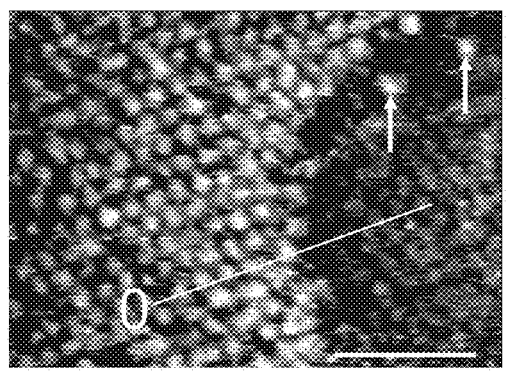
FIG. 3(d) shows height profile along the slanting shown line in FIG. 3(c), origin marked by "0". Corrugations are A=1.15 Å on UPD areas and B=0.5 Å on unaltered areas. Height difference between UPD and unaltered areas is S=1.3 Å.
Figure 3D:
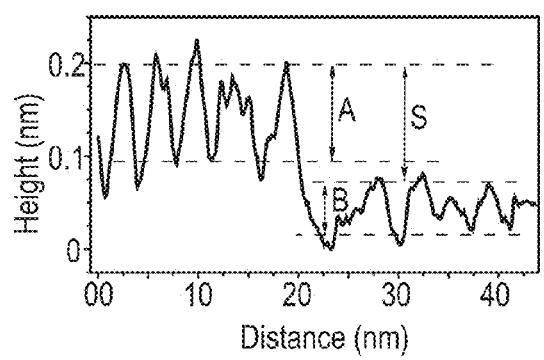
Figure 4:
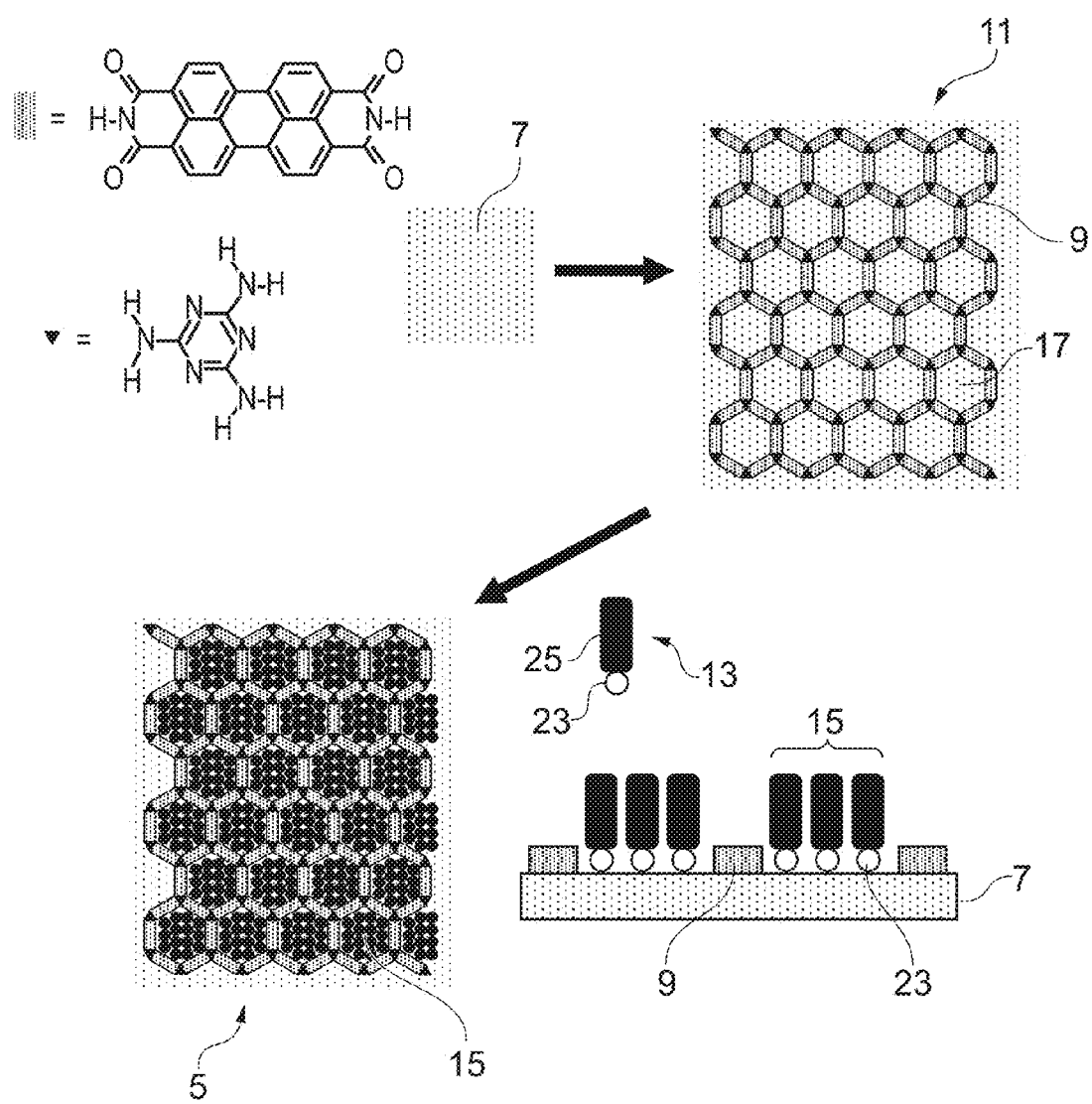
FIG. 4 shows a cartoon of a generation of molecular hybrid structure (5) consisting of a supramolecular network (9) and pore-filling molecules (13) having headgroups (23) and tails (25) able to form SAM islands (15) in the pores (17). Molecules shown are an example of a network.

To probe the insertion of Cu, experiments were performed with a deposition time chosen such that Cu UPD has not yet occurred homogeneously across the whole sample. In the STM image (FIG. 3(c)), the hexagonal structure is discernible in both the unaltered and the UPD areas. In contrast, the corresponding height profile (FIG. 3(d)) reveals an increase in height S due to Cu UPD. A most notable feature of FIG. 3(d) is the difference in the corrugation between the UPD and the unaltered area, respectively. On the UPD part the corrugation A is significantly larger compared to the corrugation B of the unaltered area. This strongly suggests that Cu is only inserted between thiol and substrate and not between network and substrate as illustrated in FIG. 3(a), i.e., the network acts as a diffusion barrier. This interpretation is corroborated by the appearance of isolated UPD islands (marked by arrows in FIG. 3(c)) where just one cell is filled. The suppression of Cu diffusion at the interface by the network makes the hybrid system very different from a uniform SAM where Cu UPD cannot be confined due to the lack of such a diffusion barrier (Silien & Buck, infra). We also note that compared to densely packed SAMs, intercalation of the Cu ions at the thiol-substrate interface is greatly facilitated and faster for the hybrid system due to the more open structure. Overall, the hybrid system renders UPD on the nanometer scale much more controllable than when using a SAM without network.

Samples were characterized under ambient by scanning tunneling microscopy (STM) using a PicoPlus STM (Molecular Imaging). Bias and currents were typically in the range of 250-800 mV (tip positive) and 5-80 pA.

EXAMPLE 3

Displacement of Molecular Network of a Hybrid Structure by Additional SAM-Forming Molecules Hybrid structures were prepared as described in Example 1 above in which pores within a network formed from PTCDI and melamine formed on 300 nm thick epitaxial gold film evaporated onto mica and in which the pores of the network were filled either ASH or an aliphatic spacer (ω-(4'-methylbiphenyl-4-yl)ethane thiol, BP2). The resultant hybrid structures were then modified by UPD deposition of copper between the thiol moieties of the ASH and BP2 SAMs and the underlying gold/mica substrate as described in Example 2. The thus-prepared hybrid structures were then subject to displacement of the PTCDI/melamine molecular network by thiols. This displacement was demonstrated using 0.5 nM solution of ASH in a mixture of ethanol/water (1:1) and $H_2SO_4$ (0.5 μM). The copper-modified hybrid structures were exposed to this solution under potential control (minus 0.6 V vs Ag/AgCl reference electrode) typically for 10 minutes, which resulted in replacement of the PTCDI/melamine molecular network by ASH. In this way, it is possible to prepare a SAM patterned on the sub-5 nm scale that comprises two different types of SAM-forming molecules (e.g. BP2 and ASH in the present example).

In this example the SAM-forming molecule displacing the PTCDI/melamine network (i.e. ASH) is different from the molecules forming the existing SAM within the pores of the network (i.e. BP2). This need not necessarily be the case, however: molecules of BP2 could likewise displace the network molecule to provide a surface decorated only with a surface comprising BP2 molecules. Advantageously, however, as described hereinbefore, the network, if displaced, may be usefully displaced with a different type of SAM-forming molecule (in particular with chemical functionality, advantageously at the tail ends of the molecules) allowing patterning of the underlying surface on the sub-5 nm scale.

This example is thus an embodiment of step 3c' in FIG. 5(a) whereby to provide structures of the type 3-2 depicted. Evidence that structures of this type were formed was achieved by way of conducting linear sweep voltammograms (LSVs) and by scanning tunneling microscopy. The results of these experiments are depicted in FIG. 6(a) and FIG. 6(b).

Figure 6A:
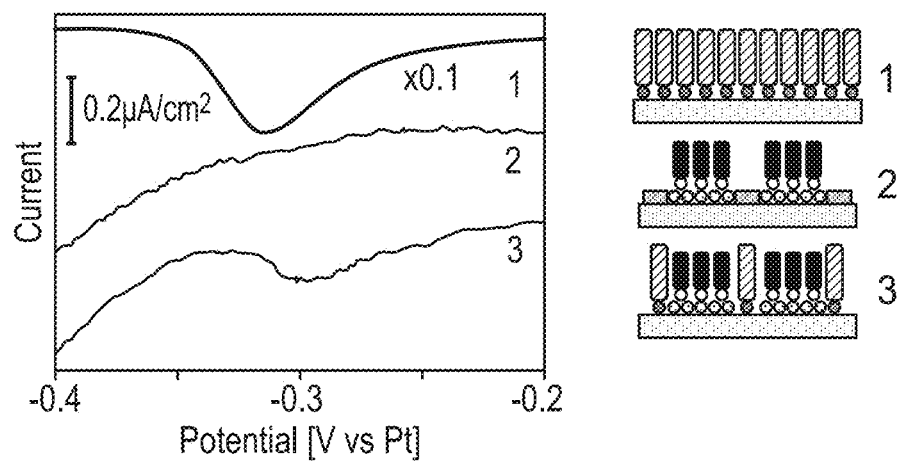
FIG. 6(a) shows linear sweep voltammograms (LSVs) in an aqueous electrolyte from three different structures (1-3) depicted schematically to the right of the LSVs.
Figure 6B:
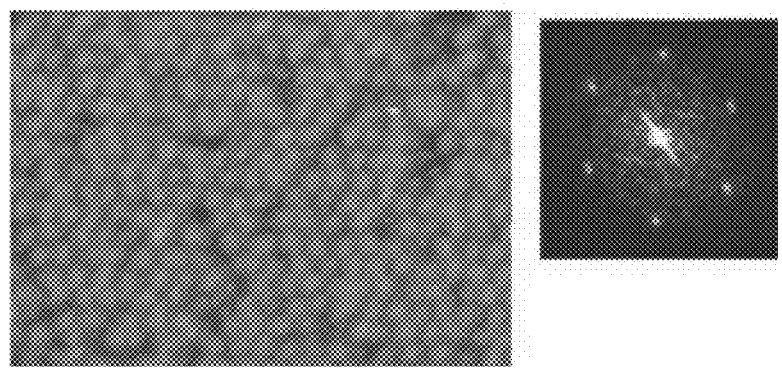
FIG. 6(b) shows on the left, a scanning tunneling microscope image and, on the right, its Fourier transform image of structure 3 in FIG. 6(a). Pattern periodicity is 3.5 nm.

FIG. 6(a) shows the electrochemical characterisation of the desired surface functionalised with the two different types of SAM-forming molecule, i.e. of structure 3-2 as depicted in FIG. 5(a). The LSV of this structure in an aqueous electrolyte is indicated with the number 3 in the LSVs shown on the left hand side of FIG. 6(a). LSVs 1 and 2 correspond to the structures 1 and 2 depicted on the right hand side of FIG. 6(a) in which 1 is a controlled uniform SAM of ASH; and 2 is a copper-modified PTCDI/melamine network/BP2 SAM hybrid structure described above before it has reacted with ASH to provide structure 3.

The LSVs were recorded in a 0.25 nM solution of KOH in ethanol/water (1:1) at a scan rate of 10 mV/s. A Teflon cell purged with nitrogen was used with platinum wires as pseudo reference and counter electrode, respectively.

The peaks seen in the LSVs demonstrate the desorption of the ASH SAM molecules with no peak detected in the LSV of structure 2 indicating that SAM within the pore is stable in the potential range shown. After replacement of the PTCDI/melamine network by the type of SAM molecule shown in structure 1 (i.e. ASH) a peak is clearly detected in the same position of the LSV of structure 3 corresponding to the peak of "pure" ASH in the LSV of the structure 1. This indicates that the replacement of the network structure with ASH was successful.

FIG. 6(b) shows, on the left hand side, a scanning tunneling microscope image and, on the right, its Fourier transform of structure 3 indicated in FIG. 6(a) and was recorded in ambient using a Pt/Ir tip (80:20) and tunneling parameters of 2-5 pA±(0.2-0.5) V. The STM image evidence is that the pattern imposed by the network is maintained throughout the replacement process. The periodicity of the pattern is 3.5 nm.

It is claimed:

1. A method for modifying a hybrid structure, the hybrid structure comprising:
   (i) a surface patterned with a two-dimensional, non-covalent self-assembled porous molecular network defined by non-covalent interactions between constituent molecules in said porous network; and
   (ii) a self-assembled monolayer adsorbed on the patterned surface, the self-assembled monolayer formed of molecules each comprising a headgroup having a particular affinity for the patterned surface,
said method comprising controllably chemically modifying the porous molecular network and/or the self-assembled monolayer.

2. The method of claim 1, wherein the hybrid structure is produced by a method comprising:
   (i) patterning a surface by forming thereon the porous molecular network; and
   (ii) depositing in the porous network and on the patterned surface the molecules so as to form the self-assembled monolayer,
wherein both the constituent molecules forming the porous molecular network and the molecules forming the self-assembled monolayer are deposited on the surface from liquids.

3. The method of claim 2 wherein the patterning is achieved by deposition of the molecules that afford the network onto the surface from a solution, a dispersion, a suspension or an emulsion of the molecules.

4. The method of claim 2 wherein the patterning is effected by contact of the surface with the constituent molecules that form the porous molecular network in a single step.

5. The method of claim 1 wherein the controlled chemical modification comprises underpotential deposition, resulting in the intercalation of metal at the SAM-surface interface.

6. The method of claim 1 wherein the controlled chemical modification comprises functionalising the tails of molecules that comprise the self-assembled monolayer with nanometer-sized objects, such as oligonucleotides, proteins or clusters of aggregated metal atoms.

7. The method of claim 1 wherein the controlled chemical modification comprises displacement of the porous molecular network.

8. The method of claim 7 wherein the controlled chemical modification comprises replacement of the porous molecular network by further molecules to form a self-assembled monolayer.

9. The method of claim 8 wherein the displacement of the porous molecular network is effected by molecules different to those from which the self-assembled monolayer is formed.

10. The method of claim 1 wherein the surface is of a substrate formed of the group consisting of gold, silver, chromium, manganese, vanadium, tungsten, molybdenum, zirconium, titanium, palladium, platinum, aluminium, iron, steel, silicon, indium phosphide, gallium arsenide, and alloys comprising one or more of the foregoing, and mixtures thereof.

11. The method of claim 1 wherein the surface is of a substrate formed of a metal.

12. The method of claim 11 wherein the metal is selected from the group consisting of gold, silver, copper, vanadium, platinum, palladium and nickel.

13. The method of claim 1 wherein the porous molecular network (9) is defined by non-covalent interactions between common or different types of constituent molecules.

14. The method of claim 13 wherein the constituent molecules comprise two or more different types of molecules.

15. The method of claim 14 wherein the constituent molecules comprise two or more different molecules selected from the group consisting of (i) melamine and higher homologs of melamine; and (ii) perylene tetra-carboxylic di-imide (PTCDI) and PTCDI analogs of naphthalene, terrylene, quaterrylene and coronene, which are optionally functionalised with one or more moieties selected from the group consisting of fullerenes, aliphatic or aromatic moieties, metal-organic or organometallic moieties, carboxylic acids, aldehydes, ethers amino groups, amides, alcohols and cyano groups.

16. The method of claim 15 wherein the constituent molecules comprise melamine and PTCDI.

17. The method of claim 13 wherein the porous molecular network is defined by non-covalent interactions between a single type of constituent molecule selected from the group consisting of porphyrins, coronenes, phthalocyanines and derivatives thereof, and dehydro-benzo[12]annulene derivatives.

18. The method of claim 1 wherein the self-assembled monolayer is formed from molecules selected from the group consisting of thiols, sulfides, or selenium-containing analogs thereof, phosphonates, phosphates, carboxylic acids and sulfonic acids.

19. The method of claim 1 wherein the self-assembled monolayer is formed from molecules deposited from a solution, emulsion or dispersion.

* * * * *